United States Patent
Adir et al.

(10) Patent No.: US 8,412,507 B2
(45) Date of Patent: Apr. 2, 2013

(54) TESTING THE COMPLIANCE OF A DESIGN WITH THE SYNCHRONIZATION REQUIREMENTS OF A MEMORY MODEL

(75) Inventors: Allon Adir, Kiryat Tivon (IL); Sigal Asaf, Zichron Yaakov (IL)

(73) Assignee: International Business Machines Corporation, Armonk, NY (US)

( * ) Notice: Subject to any disclaimer, the term of this patent is extended or adjusted under 35 U.S.C. 154(b) by 1119 days.

(21) Appl. No.: 11/947,100

(22) Filed: Nov. 29, 2007

(65) Prior Publication Data
US 2008/0133205 A1 Jun. 5, 2008

(30) Foreign Application Priority Data
Nov. 29, 2006 (GB) .................................. 0623934.7

(51) Int. Cl.
*G06F 17/50* (2006.01)
(52) U.S. Cl. .............................. 703/14; 703/22; 711/150
(58) Field of Classification Search .................... 703/26, 703/14, 22; 714/12; 711/118, 127, 141
See application file for complete search history.

(56) References Cited

U.S. PATENT DOCUMENTS

| | | | |
|---|---|---|---|
| 6,925,405 B2* | 8/2005 | Adir et al. ................. | 702/119 |
| 7,020,854 B2* | 3/2006 | Killian et al. ............... | 716/102 |
| 2006/0161897 A1* | 7/2006 | Biberstein et al. .......... | 717/124 |

OTHER PUBLICATIONS

Adir et al., "Generating Concurrent Test-Programs with Collisions for Multi-Processor Verification", Oct. 2002, High Level Design Validation and Test Workshop, 2002, 7th IEEE International, pp. 1-6.*
Yang et al, "UMM: An Operational Memory Model Specification Framework with Integrated Model Checking Capability", Concurrency and Computation: Practice and Experience, 17:465-487, 2005.*

* cited by examiner

Primary Examiner — Mary C Jacob
(74) Attorney, Agent, or Firm — William Stock; Anne Vachon Dougherty

(57) ABSTRACT

A method for compliance testing of a circuit design that includes at least one processor and a memory includes defining a memory model. The memory model includes synchronization mechanisms for synchronizing access to the memory by software instructions in different program threads running on the at least one processor. Synchronization-related parameters, which are applicable to at least one sequence of the software instructions in the different program threads, are specified. A coverage model is defined as a multi-dimensional cross-product of values of the synchronization-related parameters. At least one test program is generated using the coverage model, and a compliance of the design with the memory model is tested by subjecting the design to the at least one test program.

19 Claims, 1 Drawing Sheet

TESTING THE COMPLIANCE OF A DESIGN WITH THE SYNCHRONIZATION REQUIREMENTS OF A MEMORY MODEL

FIELD OF THE INVENTION

The present invention relates generally to design verification, and particularly to methods and systems for verifying the compliance of hardware designs with memory models.

BACKGROUND OF THE INVENTION

Many hardware circuits, such as microprocessors, comprise memory that is accessed by software. In some cases, multiple software threads operate in parallel, either on a single processor or on multiple processors of the hardware circuit. These software threads may access shared memory components. The circuit is usually designed and implemented in accordance with certain synchronization definitions, which specify the order in which different software threads access the memory under different conditions.

Several methods and systems are known in the art for testing the compliance of a design with its memory synchronization definitions. Some methods and systems generate large numbers of random memory access sequences. Such methods are described, for example, by Adir and Shurek in "Generating Concurrent Test-Programs with Collisions for Multi-Processor Verification," Proceedings of the Seventh IEEE International High-Level Design Validation and Test Workshop (HLDVT'02), Cannes, France, Oct. 27-29, 2002, pages 77-82, and by O'Krafka et al., in "A Portable Test Generator for Cache-Coherent Multiprocessors," Proceedings of the 1995 IEEE Fourteenth Annual International Phoenix Conference on Computers and Communications, Scottsdale, Ariz., Mar. 28-31, 1995, pages 38-44.

Methods and systems based on random test generation are often accompanied by monitoring methods and systems for detecting synchronization violations. Such methods and systems are described, for example, by Raghavan et al., in "Multiprocessor System Verification through Behavioral Modeling and Simulation," Proceedings of the 1995 IEEE Fourteenth Annual International Phoenix Conference on Computers and Communications, Scottsdale, Ariz., Mar. 28-31, 1995, pages 396-402, and by Saha et al., in "A Simulation-Based Approach to Architectural Verification of Multiprocessor Systems," Proceedings of the 1995 IEEE Fourteenth Annual International Phoenix Conference on Computers and Communications, Scottsdale, Ariz., Mar. 28-31, 1995, pages 34-37.

Other synchronization compliance testing methods generate tests aimed at detecting specific synchronization events. Such methods are described, for example, by Adir et al., in "Information-Flow Models for Shared Memory with an Application to the PowerPC Architecture," IEEE Transactions on Parallel and Distributed Systems, May, 2003, pages 502-515. Other methods that target specific synchronization violation scenarios are described by Collier in "Reasoning about Parallel Architectures," Prentice Hall, February, 1992, chapter 1, pages 1-13.

SUMMARY OF THE INVENTION

There is therefore provided, in accordance with an embodiment of the present invention, a method for compliance testing of a circuit design that includes at least one processor and a memory. The method includes defining a memory model, which includes synchronization mechanisms for synchronizing access to the memory by software instructions in different program threads running on the at least one processor. Synchronization-related parameters, which are applicable to at least one sequence of the software instructions in the different program threads, are specified. A coverage model is defined as a multi-dimensional cross-product of values of the synchronization-related parameters. At least one test program is generated using the coverage model, and a compliance of the design with the memory model is tested by subjecting the design to the at least one test program.

The present invention will be more fully understood from the following detailed description of the embodiments thereof, taken together with the drawings in which:

DETAILED DESCRIPTION OF EMBODIMENTS

Overview

Embodiments of the present invention provide improved methods and systems for testing the compliance of a circuit design, such as a microprocessor design, with its specified memory synchronization mechanisms. The methods described herein are based on a parametric coverage model, i.e., a model that represents the space of synchronization-related events that are of interest and indicates which events are legal. Since each event is specified by multiple parameters, the cross-product space in which the model is defined is typically multi-dimensional. In some cases, the model can be abstracted and described as a parametric template that defines a set of test scenarios, which, when aggregated, cover the different aspects of memory access synchronization.

Certain synchronization-related parameters are defined in the coverage model, such as the choice of synchronization mechanism, the type of memory being accessed and the type of read or write instruction. The coverage model is defined as the multi-dimensional cross-product of synchronization-related parameter values, or the set of all possible combinations of parameter values.

The coverage model can be used for compliance testing in several ways. For example, a test generator can use the coverage model to explicitly select parameter value combinations and generate test programs. Alternatively, the test generator can generate random tests, and a coverage analyzer can be used to monitor the tests and to assess the achieved coverage. In general, memory model compliance can be tested on the hardware implementation of the design, on a simulation of the design, or on a combination of hardware and simulated elements.

The coverage model provides an abstraction of the different aspects of memory synchronization into a single parametric model. Unlike some known compliance testing methods, generating tests using the coverage model enables the detection of synchronization-related non-compliance events using a manageable and controlled number of test programs, which simplifies the test generation process, significantly reduces the verification time and increases the verification quality. The methods and systems described herein do not rely on prior anticipation of specific suspected non-compliance events, but rather cover the space of synchronization-related parameters of the tested design.

The methods and systems described herein can be used for testing the memory synchronization of different software threads running on the tested circuit design in various configurations. Each thread comprises a sequence of instructions that generally operates in parallel to other threads. The software threads may be part of a single software process or of different processes. The tested circuit design may comprise one or more processors, and the software threads may run on a single processor or on different processors.

System Description

Figure 1:
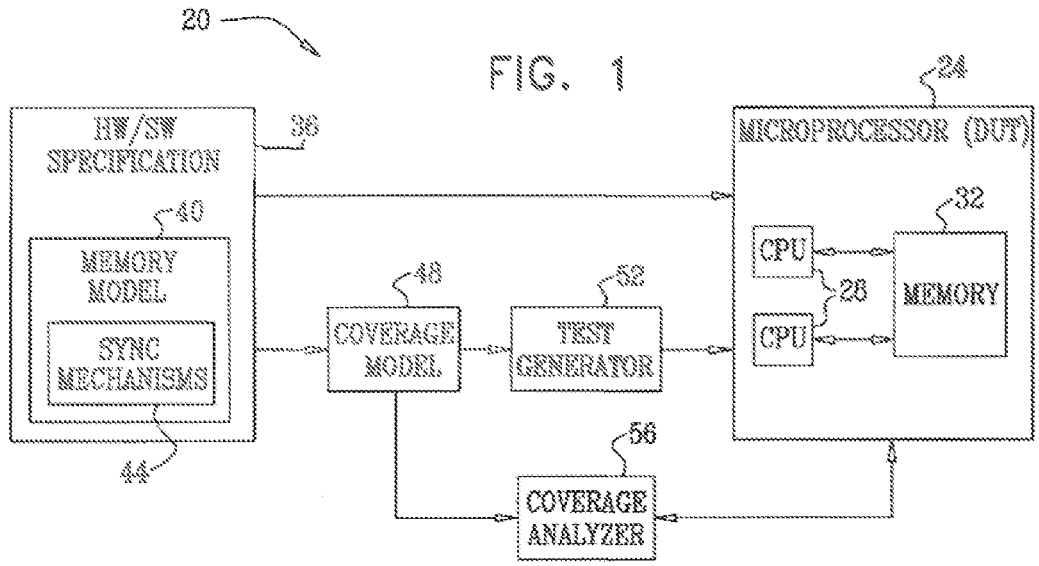
FIG. 1 is a block diagram that schematically illustrates a system for compliance testing, in accordance with an embodiment of the present invention.

FIG. 1 is a block diagram that schematically illustrates a system 20 for compliance testing of a circuit design, such as the design of a microprocessor 24, in accordance with an embodiment of the present invention. In the present example, microprocessor 24 comprises two central processing units (CPU) 28, which share a common memory 32. The simplified architecture of microprocessor 24 was chosen purely for the sake of clarity. Typically, however, the methods and systems described herein are used for testing the compliance of high-complexity microprocessors having multiple CPUs and memory devices.

Microprocessor 24 is designed and implemented in accordance with a specification 36. The specification defines, inter alia, the architecture and instruction set of the microprocessor. In particular, specification 36 comprises a memory model 40, which defines the functionality and performance of memory 32, and the ways in which CPUs 28 are observed to access the memory. In other words, the memory model specifies how a potential programmer of microprocessor 24 may control the access to the memory by different software threads, and how the memory is to function under different scenarios.

Specification 36 defines synchronization mechanisms 44 for synchronizing the access to memory 32. The synchronization mechanisms set the order in which the memory is accessed by different instruction sequences, by different CPUs and under different conditions.

In general, the microprocessor may sometimes change the order in which the instructions of a thread are executed, such as when an operand of the next instruction is not yet available. Furthermore, when the memory is shared by multiple threads, the microprocessor may schedule memory access instructions originating from different threads in different orders. As noted above, different threads may run on the same CPU or on different CPUs. In some cases, changing the order of execution may cause software complications and should not be allowed. Synchronization mechanisms 44 defined in memory model 40 attempt to avoid such error events.

In some embodiments, a synchronization mechanism comprises a dedicated synchronization instruction that is part of the instruction set of microprocessor 24. A programmer may force the microprocessor to execute an instruction sequence in the order in which it is written by inserting a synchronization instruction between two instructions in the sequence. For example, the instruction set of the PowerPC® microprocessor produced by IBM Corp. (Armonk, N.Y.) includes several synchronization instructions. Further details are available at www-03.ibm.com/chips/power/powerpc/ and in a book by Sikha et al., entitled "The PowerPC Architecture," Morgan Kaufman Publishers, second edition, June, 1994, book II, page 334.

Other synchronization mechanisms comprise rules defined in the microprocessor architecture, which prevent the microprocessor from changing the order of execution under certain conditions, without the need for explicit synchronization instructions. For example, a rule may state that memory access instructions, which refer to a common register, must be executed in the order they are written. In other words, the order of execution may be changed only for instructions that refer to disparate registers. This rule is often referred to as "data dependency." As another example, a rule may state that memory access instructions that refer to the same address must be executed in the order they are written.

In some microprocessors, the memory space is divided into areas called coherency granules, and instructions that refer to the addresses within the same coherency granule must be executed in the order they are written. In these cases, the synchronization mechanisms may apply differently to instructions that refer to identical memory addresses, to different addresses that are within the same granule, and to addresses that belong to different granules.

Different synchronization mechanisms may apply to different types of memory access instructions. For example, a particular synchronization mechanism may apply to data memory access, while another mechanism may apply to memory-mapped input/output (I/O) access and/or to register access. As another example, a particular synchronization mechanism may apply to read instructions, while another mechanism may apply to write instructions.

As yet another example, memory access instructions are sometimes cached by the microprocessor before they are executed. Some synchronization mechanisms may apply differently to cached and non-cached instructions.

Synchronization mechanisms may in general apply differently to different types of read instructions, i.e., cached or non-cached read, byte or word read, etc. Similar differentiation can be defined for write instructions.

In some cases, synchronization may be cumulative, i.e., synchronize memory accesses originating from multiple processing units. Cumulative synchronization is described, for example, by Frey in an on-line publication entitled "The PowerPC Architecture Book," book II, page 6, which is available on the IBM web site at developerworks/eserver/articles/archguide.html. In other cases, synchronization may apply only within an instruction sequence of a particular CPU.

Testing Compliance with Synchronization Mechanisms

As can be appreciated from the description above, the specification of the memory model, and in particular the specification of memory synchronization mechanisms, is complex, delicate and often contains a large number of parameters and dependencies. As such, successfully implementing the microprocessor's hardware design to fully comply with the synchronization mechanisms is a delicate and complicated task, which is prone to errors and misinterpretations.

Errors in the implementation of the synchronization mechanisms may occur, for example, when the hardware designer misinterprets the meaning of a definition in the memory model, or when the designer makes a design error. In either case, the hardware design does not comply with the specification of the memory model.

Embodiments of the present invention provide methods and systems for testing the compliance of a hardware design with the synchronization mechanisms specified in its memory model. The methods described herein are based on a parametric coverage model 48, as defined above. Typically but not necessarily, the synchronization scenarios covered by the model have a common structure, i.e., they can be written as a common, parametric software code.

For example, a certain coverage model may assume two software threads, each thread running on one of CPUs 28. One thread writes to the memory and the other reads from the memory. Consider the following model (all resources are assumed to be initialized to zero):

Writing Thread

WRITE ACCESS 1: Write "1" to RESOURCE A
SYNCHRONIZATION 1
WRITE ACCESS 2: Write "2" to RESOURCE B Reading Thread LABEL: READ ACCESS 1: Read from RESOURCE B to register R
    If R≠2, branch to LABEL
    SYNCHRONIZATION 2
    READ ACCESS 2: Read from RESOURCE A to register R
    If R≠1, report compliance bug The coverage model written above defines a parametric set of scenarios. The model is parametric since WRITE ACCESS 1, WRITE ACCESS 2, READ ACCESS 1, READ ACCESS 2, RESOURCE A, RESOURCE B, SYNCHRONIZATION 1 and SYNCHRONIZATION 2 can take different values. For example, each of the two WRITE ACCESS instructions may comprise different types of write instructions, e.g., a cached instruction, a non-cached instruction, a byte write, a word write, a direct or indexed write, or any other suitable type of write instruction. Similarly, each of the two READ ACCESS instructions may comprise different types of read instructions.

Additionally, each of RESOURCE A and RESOURCE B may comprise different types of memories, such as data memory addresses, registers and memory-mapped I/O ports. RESOURCE A and RESOURCE B may refer to the same memory address of two different addresses. When the memory model divides the memory into coherency granules, RESOURCE A and RESOURCE B may refer to addresses within the same granule or to addresses in different granules.

Further additionally, each of SYNCHRONIZATION 1 and SYNCHRONIZATION 2 may comprise any of the synchronization mechanisms defined in the memory model, e.g., an explicit synchronization instruction, a data dependency rule or any other suitable synchronization mechanism.

Coverage model 48 is defined as the multi-dimensional cross-product of the different combinations of values that the synchronization-related parameters can take. Each combination of parameter values can be translated to a test program, which, when running on the microprocessor, tests a particular aspect of memory synchronization. Each test program comprises two threads having the selected parameter values. Some parameter values may be global, i.e., associated with the entire program. For example, assume the following choice of parameter values (corresponding to a single element in the multi-dimensional cross-product):

| | |
|---|---|
| RESOURCE A: | Data memory |
| RESOURCE B: | Data memory, address different from RESOURCE A |
| WRITE ACCESS 1: | Data write, cached, store-word |
| WRITE ACCESS 2: | Data write, cached, store-byte |
| READ ACCESS 1: | Data read, non-cached, load-word |

-continued

| | |
|---|---|
| READ ACCESS 2: | Data read, non-cached, load-word-indexed |
| SYNCHRONIZATION 1: | Data dependency |
| SYNCHRONIZATION 2: | None (assuming the microprocessor architecture required global synchronization of non-cached loads) |

The following test program is based on the specific parameter values written above:

| Thread 1 | Thread 2 |
|---|---|
| Store-word 1→1000 | L: load-word non-cached 2000→R |
| load-word 1000→R | branch-condition(R!=2)→L |
| R++ | load-word-indexed non-cached 1000→R |
| Store-byte R→2000 | branch-condition(R!=1)→report error |

When threads 1 and 2 of the test program run on the two CPUs of microprocessor 24, the program tests the compliance of the hardware design with the memory model, per the specific choice of parameters. Similar test programs can be written for other choices of parameter values. Each combination of parameter values tests the design from a different angle, in terms of the synchronization requirements. Note that only the relationships between memory addresses (e.g., identical, different, belonging to the same coherency granule or to different granules) and not the actual choice of memory address values (e.g., 1000, 2000) are considered to be synchronization-related parameters.

Coverage model 48 can be used for compliance testing in several ways. In some embodiments, a test generator 52 can use the coverage model to explicitly generate test programs. The test generator typically accepts the coverage model itself and/or the relevant memory model definitions via a suitable input interface. In each test program generated by the test generator, the desired combination of parameter values (e.g., synchronization method, memory type, instruction type, etc.) is selected explicitly based on the coverage model.

The test programs may cover the entire cross-product space (i.e., all possible parameter combinations) or only selected parts of the cross-product space. Typically, generating test programs explicitly using the coverage model enables achieving high coverage of the cross-product space with a controlled and relatively small number of tests.

Alternatively, test generator 52 may generate tests regardless of the coverage model. For example, generator 52 may generate random tests. The test generator may use any suitable test generation method, such as the methods cited in the Background section above. A coverage analyzer 56 can be used to monitor the tests applied to microprocessor 24 and to assess the achieved coverage. The coverage model is typically provided to the coverage analyzer over a suitable input interface.

Further alternatively, coverage analyzer 56 may track the achieved coverage without the use of a test generator. For example, microprocessor 24 can be operated using a suitable operating system, and the coverage analyzer can track the achieved coverage under normal operation of the microprocessor.

Any suitable coverage analysis method can be used by the coverage analyzer for assessing and presenting the achieved coverage. Some exemplary methods are described in "Efficient Presentation of Functional Coverage Results," U.S. patent application Ser. No. 11/101,333, filed Apr. 7, 2005, and published on Oct. 12, 2006 as 2006-0229860-A1, now U.S. Pat. No. 7,389,215 and in "Hole Query for Functional Coverage Analysis," U.S. patent application Ser. No. 11/260,781, filed Oct. 27, 2005, now U.S. Pat. No. 7,428,715 both assigned to the common assignee and incorporated herein by reference.

Typically, test generator 52 and coverage analyzer 56 comprise general-purpose computers, which are programmed in software to carry out the functions described herein. The software may be downloaded to the computers in electronic form, over a network, for example, or it may alternatively be supplied to the computers on tangible media, such as CD-ROM.

In some embodiments, some parameter combinations can be omitted from the coverage model before the model is used for compliance testing. For example, illegal parameter combinations that are not supported by the microprocessor architecture can be removed. Trivial or uninteresting parameter combinations, such as combinations in which synchronization has no effect on the result, can also be removed.

The device-under-test (DUT) to which the tests are applied may comprise different representations of the circuit design of the microprocessor. Thus, tests can be applied at different stages of the circuit design cycle. For example, the test programs can run on the actual target hardware of microprocessor 24. Alternatively, the tests can be run on a software, hardware or firmware simulation of the microprocessor. Any suitable combination of software, firmware and/or hardware can be used to simulate microprocessor 24.

In some cases, the effectiveness of the coverage model described above can be affected by the concurrency among the different threads. This concurrency may vary, depending on the relative speed or relative timing of the writing and reading threads. For example, the writing thread may be significantly faster than the reading thread. Additionally or alternatively, the entire writing thread may be executed before the reading thread begins. In these situations, the synchronization mechanisms do not come into effect because the reading and writing threads are not concurrent, and tests based on the model given above may not successfully detect synchronization-related non-compliance events.

In some embodiments, an artificial delay can be added to the writing thread in order to increase the likelihood of achieving concurrency between the writing and reading threads. The desired delay value may be influenced, however, by the type of processor, the specific configuration tested and other factors. Furthermore, adding a large delay may significantly increase the testing time, particularly when the coverage model comprises a large number of parameter combinations.

In order to achieve concurrency between the reading and writing threads, an alternative coverage model can be used. In the following model, all resources are assumed to be initialized to zero. array is an array of size "size," which contains a list of addresses. @array[index] denotes the address held in the array element array[index]. R1, R2 and R3 are microprocessor registers.

| Writing thread |
|---|
| value=1<br>index=1<br>L1: while index≦size {<br>   if !(value=1 and index=1)<br>     SYNCHRONIZATION 1 |

| -continued |
|---|
| Writing thread |
|    WRITE value→@(array[index])<br>   index=index+1<br>   }<br>value=value+1<br>index=1<br>if reader_done=0 branch L1 |

| Reading thread |
|---|
| READ from @(array[size])→R1<br>L2: READ from @(array[size])→R2<br>   if R2=R1 then branch L2<br>   index=size−1<br>   while index≧1 {<br>     SYNCHRONIZATION 2<br>     READ from @(array[index])→R3<br>     if R3<R2, report compliance bug<br>     index=index−1<br>     R2=R3<br>   }<br>reader_done=1 |

The writing thread writes sequentially-increasing values into the elements of array, and continues to do so until the reading thread is completed (i.e., until reader_done=1). The reading thread begins to read the values in the elements of array in descending order. If, at some point, successively-read values decrease rather than increase, the reading thread concludes that a synchronization-related non-compliance event occurred. The first two instructions of the reading thread ensure that reading only starts after the writing thread performed at least one pass over @array[size].

The cross-product space in this case defines all combinations of the following parameters:

The type of memory resource pointed to by array[0 . . . size−1], e.g., data memory, register or I/O.

The type of memory resource pointed to by array[size].

The type of write instruction for writing into @(array[0 . . . size−1]), e.g., data or instruction, cached or non-cached.

The type of write instruction for writing into @(array[size]).

The type of read instruction for reading from @(array[size]).

The type of read instruction for reading from @(array[0 . . . size−1]).

The synchronization mechanism of SYNCHRONIZATION 1.

The synchronization mechanism of SYNCHRONIZATION 2.

An indication whether the memory address pointed to by @array[size] is different from the addresses pointed to by @array[0 . . . size−1]. (When the memory model specifies that the memory is divided into coherency granules, an indication whether the addresses are the same, different but within the same granule, or belong to different granules.)

Similarly to the previous coverage model, the present coverage model can be used for explicitly generating test programs, or for assessing the coverage of randomly-generated tests.

Additionally or alternatively, any other suitable coverage model can be defined. The model may comprise a higher number of threads, which may be distributed in any desired manner among the microprocessor CPUs. Some threads may comprise reading threads and others may comprise writing threads. Alternatively, threads comprising intermixed reading and writing instructions can also be used. In some embodiments, two or more coverage models can be used simultaneously to test the compliance of the design.

Compliance Testing Method Description

Figure 2:
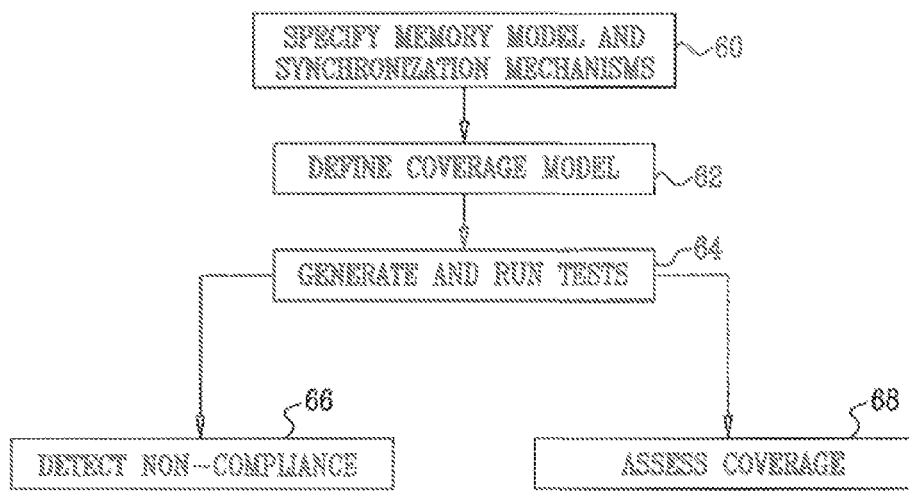
FIG. 2 is a flow chart that schematically illustrates a method for compliance testing, in accordance with an embodiment of the present invention.

FIG. 2 is a flow chart that schematically illustrates a method for memory model compliance testing, in accordance with an embodiment of the present invention. The method begins with a designer of microprocessor 24 defining the memory model and its synchronization mechanisms, at a memory model specification step 60. The designer, or a verification/testing engineer, defines a coverage model for testing the compliance of the microprocessor design with the memory model, at a coverage model definition step 62.

Test generator 52 generates and runs test programs, at a testing step 64. The test generator may either generate the tests explicitly using the coverage model, or it may alternatively generate random tests. The test results are examined in order to detect parameter combinations in which the design does not comply with the memory synchronization mechanisms defined in the memory model.

In some embodiments, for example when random testing is used, coverage analyzer 56 monitors the progress of the testing and assesses the current coverage status, at a coverage assessment step 68.

Although the embodiments described herein mainly address microprocessor design, the methods and systems described herein can also be used for testing memory synchronization compliance in any other circuit design that involves access to memory, such as buses and bus protocols, and caches and other memory devices. The microprocessor and other components may be assembled using discrete devices, as a system-on-chip (SoC) or using any other suitable fabrication method.

Although the embodiments described herein mainly refer to multiple software threads, each running on a different CPU, the methods and systems described herein can also be used for compliance testing in thread-switching applications in which the multiple software threads execute on the same CPU. Compliance testing in combined thread-switching and processor-switching applications is also feasible. In general, the tested configuration may comprise one or more software threads that run, either as part of a single process or as different processes, on a single processor or on different processors.

It will thus be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art.

The invention claimed is:

1. A method for compliance testing of a circuit design, wherein the circuit design comprises a circuit that includes at least one processor and a memory, the method comprising:
    defining a memory model, which comprises specifying synchronization mechanisms for synchronizing access to the memory by software instructions in different program threads running on the at least one processor;
    specifying synchronization-related parameters for at least one sequence of the software instructions in the different program threads;
    defining a coverage model as a multi-dimensional cross-product of different combinations of values of the synchronization-related parameters;
    generating at least one circuit design test program comprising at least two threads having parameter combinations selected based on the coverage model; and
    testing the circuit design to determine if the design complies with the synchronization mechanisms of the memory model by subjecting the circuit design to the at least one circuit design test program.

2. The method according to claim 1, wherein the circuit design comprises a microprocessor.

3. The method according to claim 1, wherein the synchronization mechanisms comprise a dedicated synchronization instruction, which is inserted into the at least one sequence of the software instructions.

4. The method according to claim 1, wherein the synchronization mechanisms comprise at least one rule selected from a group of rules consisting of rules for synchronizing instructions that access a common register of the circuit design and rules for synchronizing instructions that access a common memory address of the circuit design.

5. The method according to claim 1, wherein the synchronization-related parameters comprise at least one parameter selected from a group of parameters consisting of:
    a type of a write instruction used in the at least one sequence of the software instructions;
    a type of a read instruction used in the at least one sequence of the software instructions;
    a type of the memory; and
    a selection of one or more of the synchronization mechanisms.

6. The method according to claim 1, wherein defining the memory model comprises partitioning the memory into multiple coherency granules, wherein at least one of the synchronization mechanisms synchronizes only instructions that access addresses belonging to the same coherency granule, and wherein the synchronization-related parameters comprise an indication of whether at least some instructions in the at least one sequence of the software instructions access the same coherency granule.

7. The method according to claim 1, wherein generating the at least one test program comprises explicitly selecting values of the synchronization-related parameters based on the coverage model.

8. The method according to claim 1, wherein generating the at least one test program comprises generating a plurality of test programs, and measuring a coverage of the multi-dimensional cross-product provided by the plurality of the test programs using the coverage model.

9. The method according to claim 1, wherein defining the coverage model comprises adding to at least one of the program threads at least one instruction for improving a concurrency among the different program threads.

10. The method according to claim 1, wherein subjecting the design to the at least one test program comprises running the at least one test program on a device-under-test (DUT) comprising at least one element selected from a group of elements consisting of a hardware implementation, a firmware implementation and a software simulation of the circuit design.

11. Apparatus for compliance testing of a circuit design, wherein the circuit design comprises a circuit that includes at least one processor and a memory, comprising:

an input interface, which is arranged to accept a coverage model defined for a memory model of the circuit design, the memory model comprising synchronization mechanisms for synchronizing access to the memory by software instructions in different program threads running on the at least one processor, and which is arranged to accept a specification of synchronization-related parameters for at least one sequence of the software instructions in the different program threads, wherein the coverage model is defined as a multi-dimensional cross-product of different combinations of values of the synchronization-related parameters;

a testing generator for generating at least one circuit design test program comprising at least two threads having parameter combinations selected based on the coverage model; and a testing processor, for testing the circuit design to determine if the circuit design complies with the synchronization mechanisms of the memory model using the coverage model by subjecting the circuit design to the at least one circuit design test program.

12. The apparatus according to claim 11, wherein the testing processor is arranged to generate the at least one circuit design test program by explicitly selecting values of the synchronization-related parameters based on the coverage model.

13. The apparatus according to claim 11, wherein the testing processor is arranged to measure, using the coverage model, a coverage of the multi-dimensional cross-product provided by a plurality of test programs applied to the circuit design.

14. The apparatus according to claim 11, wherein the circuit design comprises a microprocessor.

15. The apparatus according to claim 11, wherein the testing processor is arranged to verify the compliance on a device-under-test (DUT) comprising at least one element selected from a group of elements consisting of a hardware implementation, a firmware implementation and a software simulation of the circuit design.

16. The apparatus according to claim 11, wherein the synchronization mechanisms comprise at least one mechanism selected from a group of mechanisms consisting of dedicated synchronization instructions inserted into the at least one sequence of the software instructions, rules for synchronizing instructions that access a common register of the circuit design and rules for synchronizing instructions that access a common memory address of the circuit design.

17. The apparatus according to claim 11, wherein the synchronization-related parameters comprise at least one parameter selected from a group of parameters consisting of:
    a type of a write instruction used in the at least one sequence of the software instructions;
    a type of a read instruction used in the at least one sequence of the software instructions;
    a type of the memory; and
    a selection of one or more of the synchronization mechanisms.

18. The apparatus according to claim 11, wherein the memory model divides the memory into multiple coherency granules, wherein at least one of the synchronization mechanisms synchronizes only instructions that access addresses belonging to the same coherency granule, and wherein the synchronization-related parameters comprise an indication whether at least some instructions in the at least one sequence of the software instructions access the same coherency granule.

19. A computer software product for compliance testing of a circuit design wherein the circuit design comprises a circuit includes at least one processor and a memory, the product comprising a non-transitory computer-readable medium, in which program instructions are stored, which instructions, when read by a computer, cause the computer to perform steps of:

accepting a coverage model defined for a memory model of the circuit design, the memory model comprising synchronization mechanisms for synchronizing access to the memory by software instructions in different program threads running on the at least one processor, and the coverage model defined as a multi-dimensional cross-product of different combinations of values of the synchronization-related parameters, to accept a specification of synchronization-related parameters for at least one sequence of the software instructions in the different program threads;

generating at least one circuit design test program comprising at least two threads having parameter combinations selected based on the coverage model; and testing the circuit design to determine if the design complies with the synchronization mechanisms of the memory model using the coverage model by subjecting the circuit design to the at least one circuit design test program.

* * * * *